United States Patent [19]

Iinuma et al.

[11] 4,217,516

[45] Aug. 12, 1980

[54] PROBE FOR ULTRASONIC DIAGNOSTIC APPARATUS

[75] Inventors: Kazuhiro Iinuma; Kinya Takamizawa; Ichiro Ogura, all of Yokohama, Japan

[73] Assignee: Tokyo Shibaura Electric Co., Ltd., Japan

[21] Appl. No.: 790,743

[22] Filed: Apr. 25, 1977

[30] Foreign Application Priority Data

Apr. 27, 1976 [JP] Japan ................................ 51-48037

[51] Int. Cl.2 ............................................ H01L 41/10

[52] U.S. Cl. .................................... 310/335; 128/660; 73/642; 367/150

[58] Field of Search ............... 128/2 V, 2.05 Z, 24 A, 128/660-663; 73/632-633, 640, 618-621, 641, 644, 67.85, 71.5 US; 310/334-337, 322, 326-328, 340; 350/190; 340/8 L; 367/150

[56] References Cited

U.S. PATENT DOCUMENTS

| | | | |
|---|---|---|---|
| B 270;274 | 2/1976 | Green | 340/8 L |
| 2,477,246 | 7/1949 | Gillespie | 340/10 |
| 3,166,731 | 1/1965 | Joy | 73/626 |
| 3,277,451 | 10/1966 | Parssinen | 340/10 |
| 3,387,604 | 6/1968 | Erikson | 310/35 |
| 3,771,354 | 11/1973 | Miller | 73/644 |
| 3,854,060 | 12/1974 | Cook | 310/326 |
| 3,886,489 | 5/1975 | Jones | 340/10 |
| 3,936,791 | 2/1976 | Kossoff | 128/2 V |
| 3,938,502 | 2/1976 | Bom | 128/2.05 Z X |
| 3,939,467 | 2/1976 | Cook et al. | 310/334 X |
| 3,958,559 | 5/1976 | Glenn et al. | 128/2 V |
| 3,971,962 | 7/1976 | Green | 310/322 |

OTHER PUBLICATIONS

Hertz, C. H. "UTS Engrg. in Heart Diagnosis," Amer. Jrnl. Cardiology, vol. 19, Jan. 1967 pp. 6-17.

CRC Handbook, CRC Publish, 1964 p. E-28.

*Primary Examiner*—William E. Kamm

*Assistant Examiner*—Francis J. Jaworski

*Attorney, Agent, or Firm*—Finnegan, Henderson, Farabow, Garrett & Dunner

[57] ABSTRACT

A probe for an ultrasonic diagnostic apparatus is provided which has a supporting plate and a plurality of electro-acoustic transducers arranged in a line on the supporting plate. A thin film with flexibility and water-tightness is attached to the electro-acoustic transducers so that the spaces between the adjacent electro-acoustic transducers are hermetically sealed. The result is a reduction in the acoustic coupling between the adjacent transducers.

19 Claims, 7 Drawing Figures

PROBE FOR ULTRASONIC DIAGNOSTIC APPARATUS

The present invention relates to a probe for an ultrasonic diagnostic apparatus and, more particularly, to one with a reduced acoustic coupling factor among the electro-acoustic transducers of the probe.

In an ordinary ultrasonic diagnostic apparatus, the electro-acoustic transducers comprising piezoelectric resonators generate ultrasonic pulses to the portion of a living body to be observed, and successively detect the ultrasonic pulse reflected on the boundaries among the organs of the living body. By changing the direction of the ultrasonic pulses directed into the living body, information about the two dimensional structure of the organs of the living body is obtained and is displayed on a CRT. In a conventional scanning type ultrasonic diagnostic apparatus, the radiation direction of the ultrasonic pulses is changed in such a manner that a fixed probe having a plurality of electro-acoustic transducers is placed in position and a voltage is successively applied to the electro-acoustic transducers, or voltages with different phases are applied to the respective electro-acoustic transducers at the same time. In this case, the acoustic coupling factor among the electro-acoustic transducers must be minimized.

For protection of the electro-acoustic transducers and for obtaining good and comfortable contact of living body with the probe, the upper surface of the electro-acoustic transducers, by convention, is coated with Araldite (trade name) or other epoxy resin and then the coating is polished to have a predetermined thickness. In this case, when the resin is coated over the entire surfaces of transducers, it is in a molten state and its viscosity is small. For this reason, the resin tends to enter the respective gaps between adjacent transducers and, when it is solidified, the adjacent transducers are coupled with a high acoustic coupling.

Accordingly, the primary object of the present invention is to provide a probe for an ultrasonic diagnostic apparatus with a minimized acoustic coupling among the electro-acoustic transducers.

In one form of the preferred embodiments of the present invention, there is provided a probe for an ultrasonic diagnostic apparatus comprising a supporting means, a plurality of electro-acoustic transducers arranged on the supporting means and a flexible film fixed on the electro-acoustic transducers.

Other objects and features of the present invention will be apparent from the following description taken in connection with the accompanying drawings, in which.

Figure 1:
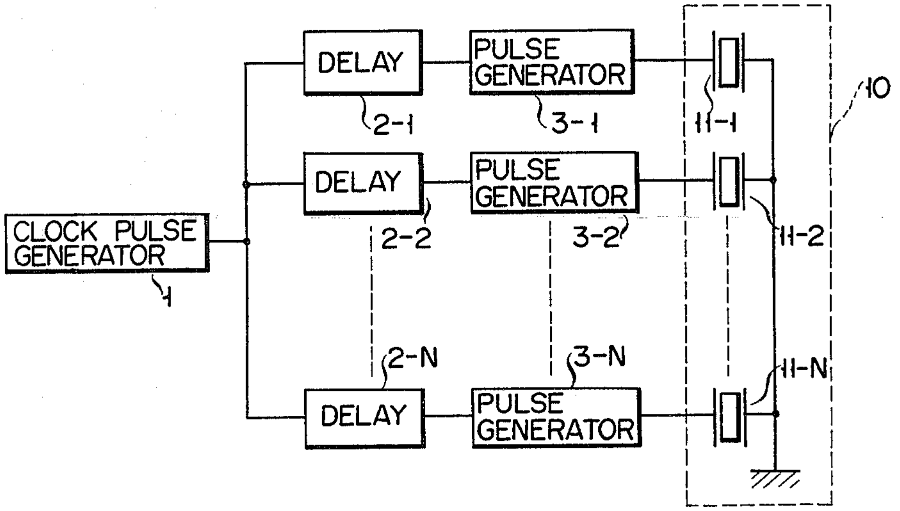
FIG. 1 is a block diagram of a sector scanning type ultrasonic diagnostic apparatus with a probe for the ultrasonic diagnostic apparatus, the probe being an embodiment of the present invention.

Reference will not be made to FIG. 1 illustrating a sector scanning type ultrasonic diagnostic apparatus into which a probe 10 with a plurality of electro-acoustic transducers 11-1 to 11-N according to the present invention is incorporated. The diagnostic apparatus is comprised of a clock pulse generator 1, delay circuits 2-1 to 2-N for producing the signals fed from the clock pulse generator 1 with a predetermined delay time, and pulse generators 3-1 to 3-N which are driven by the delay circuits 2-1 to 2-N to deliver pulse signals to the electro-acoustic transducers 11-1 to 11-N to enable the transducers to generate ultrasonic pulses. Note that the time delays of the individual delay circuits may be controlled so as to have various values. The directions of the ultrasonic pulses radiated from the probe 10 are successively changed by controlling the delay circuits 2-1 to 2-N in such a manner the the delay times of the delay circuits are made equal, gradually smaller or gradually larger.

The ultrasonic pulses which are reflected from a living body and received by the electro-acoustic transducers 11-1 to 11-N are converted into electric signals in the transducers and then delivered to the signal processing circuit (not shown) through delay circuits (not shown) having the same amount of delay times of the delay circuits 2-1 to 2-N.

Figure 2:
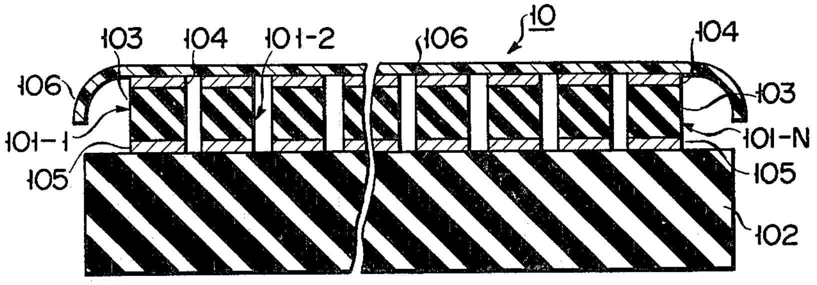
FIG. 2 is a cross sectional view of the probe for the ultrasonic diagnostic apparatus shown in FIG. 1.

A detailed construction of the probe 10 shown in FIG. 1 is illustrated in FIG. 2. In FIG. 2, a case for enclosing the probe 10 and connection wires connecting the probe 10 to the pulse generators 3-1 to 3-N are omitted, for purpose of simplicity of explanation.

As shown in FIG. 2, a plurality of electro-acoustic transducers 101-1 to 101-N are disposed in a line on a supporting plate 102 made of, for example, ultrasonic absorbing material. The transducers are arranged in parallel with and at an equal interval from one another. Each transducer is comprised of a piezoelectric element 103 and electrodes 104 and 105 formed on the top and bottom surfaces of the piezoelectric element 103. These electrodes are baked or vapour deposited on the top and bottom surfaces of the piezoelectric element. The top electrodes 104 are connected to the corresponding external connection terminals through lead wires (not shown), respectively. The electrodes 105 are connected commonly to a ground terminal.

Generally, the width of each transducer 101 is about 0.5 mm and the distance between adjacent transducers is very narrow, e.g. 0.1 mm. In fabrication of the probe 10, metal layers such as silver are first formed on both the opposite surfaces of a single rectangular piezoelectric plate. Then, the piezoelectric plate with the electrode metals formed is fixed on a supporting plate. Following this, the piezoelectric plate is cut by means of a cutting device with a thin blade such as a grinding wheel into the plural number of piezoelectric elements. As a result, the plural electro-acoustic transducers are obtained which are disposed on the supporting plate in parallel and at equal intervals, as mentioned above. After this step, a flexible and watertight thin film 106 with thickness of about 10 $\mu$m is attached onto the top surfaces of the electro-acoustic transducers 101 by a suitable way such as glueing or pressure. In this case, each space or gap between adjacent transducers is closed at the top by the film 106. The thin film may be formed of nylon sheet, polyester film, a sheet of other synthetic resin, rubber film or the like.

In the probe 10 shown in FIG. 2, air having considerably different acoustic impedance from that of the piezoelectric element exists between respective adjacent electro-acoustic transducers. Therefore, the acoustic coupling factor between the transducers 101 is remarkably small. Since the thin film 106 is flexible, i.e. it has a small stiffness, vibratory interference among electro-acoustic transducers 101-1 to 101-N is minimized. Moreover, because of watertightness or liquid-nonpermeability of the thin film 106, even if the probe is directly touched to the living body coated with paste or coupling medium for ensuring a close contact of the probe with the human body, the transducers do not directly touch the coupling medium, thereby properly protecting the transducers. It is to be noted further that since the film 106 is very thin, e.g. 10 to 100 μm, the vibration mode of the transducers is little affected by the use of the thin film.

Figure 3:
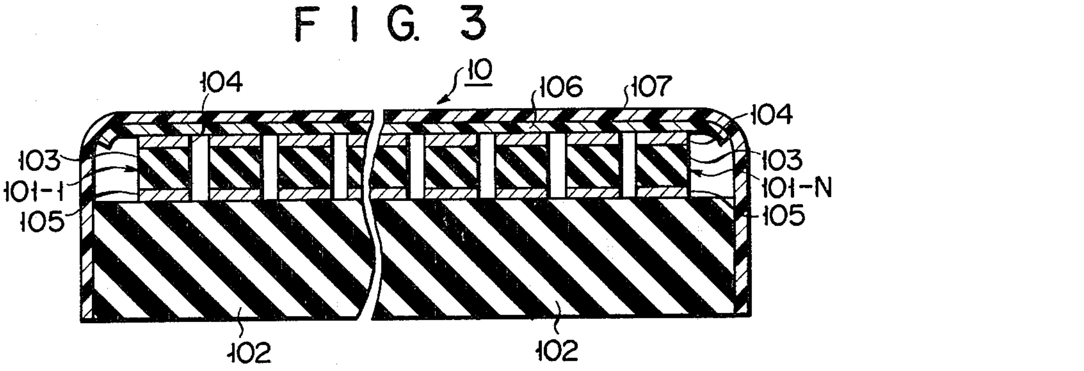
FIG. 3 is a cross sectional view of the probe for the ultrasonic diagnostic apparatus of another embodiment of the present invention in which a protecting film is additionally used for the probe.

In the case where a nylon sheet having a 10 μm thickness is used or the like. Consequently, a protective measurement must be taken for protecting such a film. For this, in FIG. 3, an additional protecting film 107 formed of flexible and friction proof material, for example, epoxy resin or rubber, is laid over the thin film 106. For ensuring an effective signal transmission in the transducer, it is desirable to select the acoustic impedance of the film 107 to have a value between those of the piezoelectric element and water or living body, and set the thickness of the protecting film 107 to be ¼ of the radiated ultrasonic pulse wave-length. The protecting film 107 may be formed, for example, by coating epoxy resin over the thin film 106. Incidentially, in this case, the resin does not enter into the spaces of the electro-acoustic transducers because of the thin film 106. This effect is further ensured if the protecting film 106 is made of watertight or liquid-nonpermeating material. As shown in FIG. 3, the protecting film 107 may be used to cover not only the thin film 106 but also the entire sides of the supporting place 102. In this case, the electro-acoustic transducers are enclosed in a space defined by the substrate 102 and the protecting film 107.

Figure 4:
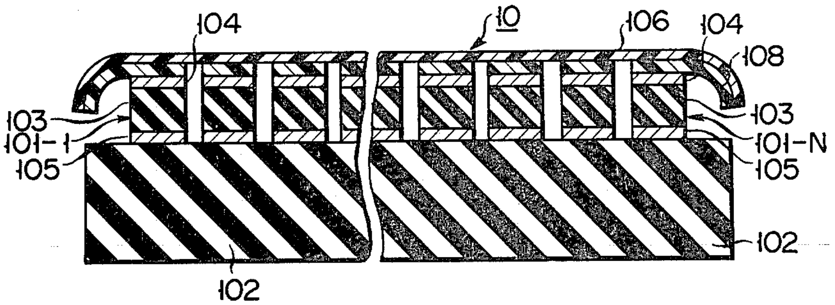
FIG. 4 is a cross sectional view of another embodiment of the probe for the ultrasonic diagnostic apparatus according to the present invention in which narrow, range amplitude ultrasonic pulses are generated.

Another embodiment of the present invention is illustrated in FIG. 4. In this example, intermediate layers 108 are laid between the transducers 101 and the thin film 106. The acoustic impedance of the intermediate layer 108 is selected to be between those of the piezoelectric element 103 and water or the living body and the thickness of the intermediate layer 108 is set to be about ¼ of the wavelength of the radiated ultrasonic pulses. The material used for the intermediate layer 108 is epoxy resin, for example. By the use of the intermediate layer 108, pulses with narrow pulse widths and large amplitudes, are produced from the electro-acoustic transducers 101. In fabrication of the probe shown in FIG. 4, a piezoelectric plate with electrodes formed on the upper and lower surfaces is first fixed onto a supporting plate. The epoxy resin, for example, is coated over the electrode of the upper surface of the piezoelectric element to form the intermediate layer 108. Then, the piezoelectric plate 103, the upper and lower electrodes 104 and 105, and the intermediate layer 108 are cut by a suitable cutting device to form a series of transducers arranged in parallel and at equal intervals. Finally, the thin film 106 is attached to the intermediate film 108.

Figure 5:
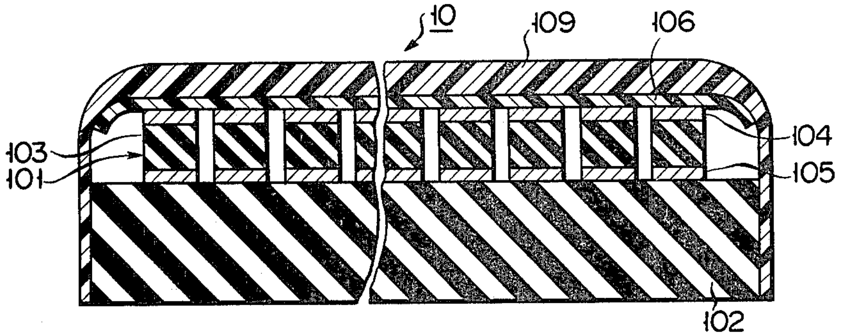
FIGS. 5 and 6 are cross sectional views of another embodiment of the probe for the ultrasonic diagnostic apparatus in which a protecting film is made in the cylindrical lens form.
Figure 6:
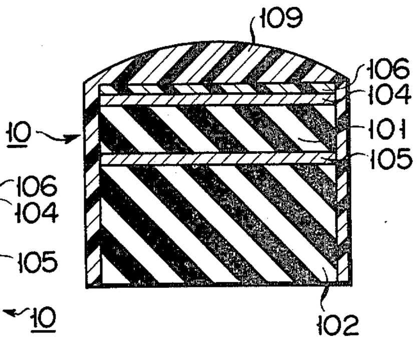

Instead of the flat protecting film 107 of the probe 10 shown in FIG. 3, a protecting film 109 which is made in the cylindrical lens form as shown in FIGS. 5 and 6 can be used. As clearly understood from FIG. 5 the protecting film 109 is formed constant in thickness along the line of arrangement of the transducers 101, and as shown in FIG. 6, the protecting film 109 is formed thick in the top central area and thinner in a direction of both top end portions. The protecting film 109 is formed of, for example, silicon rubber in which a ultrasonic wave travels at a lower speed than in water or living body. With the probe 10 shown in FIGS. 5 and 6, an ultrsonic beams radiated from each of the transducer 101 is focussed at a point on the central axis of the transducer.

Figure 7:
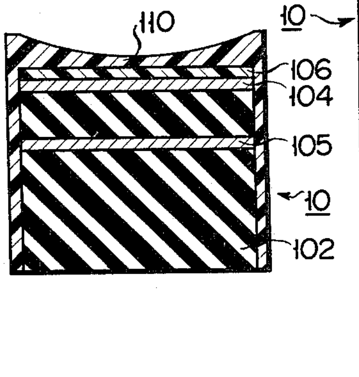
FIG. 7 is a cross sectional view of another embodiment of the probe for the ultrasonic diagnostic apparatus.

Instead of the flat protecting film 107 of the probe 10 shown in FIG. 3, a protecting film 110 can be used as shown in FIG. 7. Like the protecting film 109 in FIGS. 5 and 6, the protecting film 110 is formed constant in thickness along the line of arrangement of the transducers. However, as clearly shown in FIG. 7, the protecting film 110 is made thin in the central are ι and thicker in a direction of both end portions. The protecting film 110 is formed of a material such as acrylic resin in which ultrasonic waves travel at a higher speed than in water or living body. Thus, the probe shown in FIG. 7 can produce ultrasonic waves in the same manner as the probe shown in FIGS. 5 and 6.

It will be understood that the present invention is not limited to the examples heretofore described, but may be changed or modified without departing from the spirit and scope of the prevent invention. For example, the probe described above is used for both receiving and transmitting the ultrasonic pulses; however, it may be used exclusively for receiving or transmitting them. Further, in the example of FIG. 4, after the intermediate layer 108 is coated over the electrode 104, the piezoelectric plate is cut together with the intermediate layer 108 to form a plurality of electro-acoustic elements, as will be recalled. However, after the piezoelectric plate is cut, an intermediate layer which is flexible may be coated over the transducers so as to enclose the top end of each space between adjacent transducers.

What we claim is:

1. A probe for electronic scanning-type ultrasonic apparatus comprising:

(a) supporting means;

(b) a plurality of electro-acoustic transducers to be energized substantially at the same time, the transducers having bottom surfaces fixedly positioned and supported in spaced relationship in a linear array on the supporting means to form fixed acoustically decoupling gaps between adjacent transducers and having corresponding top surfaces arranged substantially parallel to the bottom surfaces;

(c) a flexible film fixedly laid over the top surfaces of the transducers and closing the tops of the decoupling gaps without filling the gaps to minimize acoustic coupling and vibratory interference between adjacent transducers; and (d) a protective film laid over said flexible film and formed of material in which ultrasonic waves travel at a higher speed than in water, said protective film being constant in thickness along the sides of said transducers, thin in the top central area and thick in both top end portions to form a concave shape.

2. A probe according to claim 1, in which said flexible film is formed of liquid-nonpermeating material.

3. A probe according to claim 1, in which said supporting meanas is formed of ultrasonic absorbing material.

4. A probe according to claim 1, wherein said protective film has an acoustic impedance between those of said electro-acoustic transducers and water.

5. A probe according to claim 1, wherein said flexible film is comprised of intermediate layers fixed on the top surfaces of said electro-acoustic transducers and a sheet laid over said intermediate layers to close the gaps between respective adjacent electro-acoustic transducers.

6. A probe according to claim 5, wherein said intermediate layers have an acoustic impedance between those of said electro-acoustic transducers and water.

7. The probe according to claim 1 wherein each of said transducers is formed of a piezoelectric element having top and bottom surfaces parallel to each other and first and second electrodes respectively fixed on the top and bottom surfaces of said piezoelectric element.

8. A probe according to claim 1 wherein said protective film is laid over said supporting means to hermetically seal said electro-acoustic transducers in cooperation with said supporting means.

9. A probe for electronic sector scanning-type ultrasonic apparatus comprising:

(a) supporting means;

(b) a plurality of electro-acoustic transducers to be energized substantially at the same time, the transducers having bottom surfaces fixedly positioned and supported in spaced relationship in a linear array on the supporting means to form fixed acoustically decoupling gas-gaps between adjacent transducers and having corresponding top surfaces arranged substantially parallel to the bottom surfaces;

(c) a flexible film fixedly laid over the top surfaces of the transducers and closing the tops of the decoupling gas-gaps without filling the gas-gaps to minimize acoustic coupling and vibratory interference between adjacent transducers; and (d) a protective film laid over said flexible film and formed of material in which ultrasonic waves travel at a lower speed than in water, said protective film being made constant in thickness along the line of arrangement of the transducers, thick in the top central portion and thin in both top end portions to form a convex shape.

10. The probe according to claim 9 wherein each of said transducers is formed of a piezoelectric element having top and bottom surfaces parallel to each other and first and second electrodes respectively fixed on the top and bottom surfaces of said piezoelectric element.

11. The probe of claim 9 wherein said flexible film is comprised of intermediate layers fixed on the top surfaces of said electro-acoustic transducers and a sheet laid over said intermediate layers to close the gaps between respective adjacent electro-acoustic transducers.

12. The probe according to claim 9 wherein said protective film has an acoustic impedance between those of said electro-acoustic transducers and water.

13. A probe according to claim 9 wherein said protective film is laid over said supporting means to hermetically seal said electro-acoustic transducers in cooperation with said supporting means.

14. The probe of claim 9 wherein said supporting means is formed of ultrasonic absorbing material.

15. An electronic sector scanning-type ultrasonic wave generating apparatus comprising:

(a) signal generating means for generating a plurality of electric signals having a changeable phase relationship;

(b) supporting means formed of ultrasonic absorbing material;

(c) a plurality of electro-acoustic transducers to be energized by respective output signals of the signal generating means for emitting an ultrasonic wave beam in a direction defined by the phase relationship of the electric output signals from the signal generating means, the transducers having bottom surfaces fixedly positioned and supported in spaced relationship in a linear array on the supporting means to form fixed acoustically decoupling gaps between adjacent transducers and having corresponding top surfaces;

(d) a flexible film fixedly laid over the top surfaces of the transducers and closing the tops of the decoupling gaps without filling the gaps to minimize acoustic coupling and vibratory interference between adjacent transducers; and (e) a protective film laid over said flexible film and formed of material in which ultrasonic waves travel at a higher speed than in water, said protective film being constant in thickness along the sides of said transducers, thin in the top central area and thick in both top end portions to form a concave shape.

16. The electronic apparatus of claim 15 wherein the width of each transducer is 0.5 mm and the distance between adjacent transducers is 0.1 mm.

17. The electronic apparatus of claim 15 wherein the flexible film has a thickness of between 10–100 micrometers.

18. The electronic apparatus of claim 15 wherein the flexible film is formed of a material selected from the group consisting of nylon sheet, polyester film, synthetic resin and rubber film.

19. An electronic sector scanning-type ultrasonic wave generating apparatus comprising:

(a) signal generating means for generating a plurality of electric signals having a changeable phase relationship;

(b) supporting means formed of ultrasonic absorbing material;

(c) a plurality of electro-acoustic transducers to be energized by respective output signals of the signal generating means for emitting an ultrasonic wave beam in a direction defined by the phase relationship of the electric output signals from the signal generating means, the transducers having bottom surfaes fixedly positioned and supported in spaced relationship in a linear array on the supporting means to form fixed acoustically decoupling gaps between adjacent transducers and having corresponding top surfaces;

(d) a flexible film fixedly laid over the top surfaces of the transducers and closing the tops of the decoupling gaps without filling the gaps to minimize acoustic coupling and vibratory interference between adjacent transducers; and (e) a protective film laid over said flexible film and formed of material in which ultrasonic waves travel at a lower speed than in water, said protective film being constant in thickness along the line of arrangement of the transducers, thick in the top central portion and thin in both top end portions to form a convex shape.

* * * * *